United States Patent
Yoshida

(10) Patent No.: US 7,952,164 B2
(45) Date of Patent: May 31, 2011

(54) SEMICONDUCTOR DEVICE

(75) Inventor: Kazuhiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 52 days.

(21) Appl. No.: 12/607,450

(22) Filed: Oct. 28, 2009

(65) Prior Publication Data

US 2010/0109125 A1    May 6, 2010

(30) Foreign Application Priority Data

Oct. 31, 2008   (JP) ................. 2008-281412

(51) Int. Cl.
*H01L 29/00*    (2006.01)
*H01L 29/8605*    (2006.01)

(52) U.S. Cl. ............. 257/536; 257/539; 257/E29.326

(58) Field of Classification Search .......... 257/536, 257/539, E29.326
See application file for complete search history.

(56) References Cited

U.S. PATENT DOCUMENTS

| | | | |
|---|---|---|---|
| 4,110,776 A * | 8/1978 | Rao et al. .............. | 257/379 |
| 6,492,687 B2 * | 12/2002 | Imam et al. ............ | 257/365 |
| 6,713,818 B2 * | 3/2004 | Kodama ................ | 257/362 |
| 6,828,636 B2 | 12/2004 | Fujiishi et al. | |
| 7,528,446 B2 * | 5/2009 | Takafuji et al. ........ | 257/347 |
| 2003/0080316 A1 | 5/2003 | Fujiishi et al. | |
| 2006/0267142 A1 * | 11/2006 | Ota ..................... | 257/532 |

FOREIGN PATENT DOCUMENTS

JP         2003-133315          5/2003

* cited by examiner

*Primary Examiner* — Luan C Thai
(74) *Attorney, Agent, or Firm* — Young & Thompson

(57) ABSTRACT

The semiconductor device includes a resistor cell that includes a diffused layer resistor, a P-well contact and an N-well contact. The diffused layer resistor is arranged on a semiconductor substrate and is formed by a diffused layer. The P-well contact surrounds an outer rim of the diffused layer resistor and is formed by another diffused layer. The N-well contact is arranged surrounding the outer rim of the P-well contact and is formed by a further diffused layer. Both the P-well and N-well contacts are partitioned into contact portions. Control electrode layer portions are arranged between neighboring contact sections of the P-well contact so the contact sections of the P-well contact and the control electrode layer portions alternate. Control electrode layer portions are arranged between neighboring contact sections of the N-well contact so that the contact sections of the N-well contact and the control electrode layer portions alternate with one another.

18 Claims, 5 Drawing Sheets

SEMICONDUCTOR DEVICE

REFERENCE TO RELATED APPLICATION

This application is based upon and claims the benefit of the priority of Japanese patent application No. 2008-281412, filed on Oct. 31, 2008, the disclosure of which is incorporated herein in its entirety by reference thereto.

BACKGROUND OF THE INVENTION

1. Field of the Invention

This invention relates to a semiconductor device. More particularly, it relates to a semiconductor device including an element, such as a resistor cell array, which is formed in a semiconductor layer but which is not provided with a control electrode layer, such as a polysilicon layer, provided on top of the semiconductor layer.

2. Description of Related Art

In general, a supply power generation circuit mounted on a semiconductor device along with a logic circuit constructed by a MIS transistor, a memory and so forth, is constructed by a circuit that makes use preferentially of a plurality of resistor cells. In a layout pattern of such resistor cells, a diffused layer resistor, constructed by a diffused layer of a high sheet resistance, is preferentially used. The resistors cell layout pattern is constructed by arranging several to tens of arrays of the diffused layer resistors as shown in FIGS. 4A and 4B (related art example 1). In FIGS. 4A and 4B, it is necessary to protect a diffused layer resistor 107 (N-diffused layer) from adverse effects of noise from a semiconductor substrate (P-sub) 101 or noise from neighboring diffused layer resistors 107. To this end, each diffused layer resistor 107 (N-diffused layer) is formed in a region of a P-well 105 (P-well) surrounded by a deep-N-well 102 (deep N-well) and by an N-well 103 (N-well). The diffused layer resistor 107 (N− diffused layer) is surrounded by a P-well contact 106 (P+ diffused layer), which in turn is surrounded by an N-well contact 104 (N+ diffused layer).

[Patent Document 1]
  JP Patent Kokai Publication No. JP2003-133315A

SUMMARY

In the resistor cell layout pattern of FIGS. 4A and 4B (related art example 1), the diffused layer resistor 107, P-well contact 106 and the N-well contact 104 are constructed by diffused layers, and are completely devoid of a polysilicon layer, thus in a manner different from the case of an ordinary MIS transistor constructed by a diffused layer and a polysilicon layer (gate electrode). That is, the resistor cell layout pattern is completely devoid of a polysilicon layer. However, there exists a polysilicon layer, as a gate electrode layer, in a MIS transistor arranged in a separate region distinct from the resistor cell layout pattern. Ordinarily, a plurality of the MIS transistors make up a logic circuit, and the polysilicon layer constitutes a gate electrode and an input signal line of each of the MIS transistors. That is, the polysilicon layer forms a gate electrode layer. Thus, the density of the polysilicon layer is drastically reduced in a region where the resistor cell layout pattern is arranged, in comparison with the other separate regions where the MIS transistors are arranged. Hence, in a resistor cell layout pattern region, an interlayer insulating film prior to being planarized by CMP (Chemical Mechanical Polishing) is destitute of raised regions but is planar in comparison with the other region where there is provided the polysilicon layer. If the interlayer insulating film, disposed on a wafer in such state, is planarized by CMP, the portion of the planar interlayer insulating film, arranged in the region of the diffused layer resistor 107, is excessively polished. Under the effect of such excess polishing, the gate electrode of the MIS transistor, provided below the portion of the interlayer insulating film, arranged in the distinct region, is also ground off. As a result, the channel width of the MIS transistor becomes narrower, that is, smaller than a design value, thus lowering the threshold voltage Vt of the MIS transistor (so-called reverse narrow channel effect). Such narrow channel effect is produced in a MIS transistor that is arranged in the relative vicinity of the resistor cell layout pattern and that therefore is more likely to be affected by excessive polishing. Specifically, the reverse narrow channel effect denotes a phenomenon in which, as a result of narrowing down of the channel width of the MIS transistor, an electrical field from the gate electrode is concentrated in the vicinity of an interface between the gate insulating film and the channel, thereby lowering the threshold voltage Vt at which the MIS transistor is to be operated (turned on of off). Should the threshold value Vt of the MIS transistor be lowered, there is produced an offset from the design value of the MIS transistor, thus ultimately affecting the circuit characteristics.

To meet this situation, a region in which to provide polysilicon layers 109a, 109b is provided between the P-well contact 106 and the N-well contact 104 or between the diffused layer resistor 107 and the P-well contact 106, as shown in FIGS. 5A and 5B (related art example 2). The polysilicon layers 109a, 109b are provided in such regions in order to avoid excessive polishing during the process of planarization by CMP. As an example technique of the related art of this sort, there is disclosed in Patent Document 1 such a technique in which a word line (transfer gate) is arranged surrounding a resistor band on top of a semiconductor substrate (related art example 3).

However, with the related art example 2, in which a polysilicon layer is arranged inevitably in the region of the resistor cell layout devoid of the polysilicon layer, the resistor layout size is increased. In addition, with the related art example 3 (Patent Document 1), in which the word line (transfer gate) is arranged surrounding the outer rim of the resistor band, the transfer gate density may be excessively high. With the transfer gate density excessively high, the thickness of the portion of the interlayer insulating film, formed on top of the transfer gates, is thicker than that of the portion of the interlayer insulating film where the transfer gate density is low. If, under this condition, the entire wafer is planarized, the portion of the interlayer insulating film overlying the region of high transfer gate density is left to produce a step difference to render CMP difficult. In case polishing is continued further in order to remove the portion of the interlayer insulating film left or the excess transfer gate portions, other low transfer gate density regions where there is no resistor band are polished in excess. There is thus a fear that the value of the threshold value of a transistor, provided in such other regions, is lowered.

In the foregoing description of the excessive polishing, it has been shown that excessive polishing may take place in the case of the resistor cell layout pattern taken as an instance of an element devoid of the polysilicon layer (transfer gate in the case of the related art example 3). An arrangement in which a diode is provided in place of the diffused layer resistor 107 in FIGS. 4A and 4B may be obtained by forming an N-type diffused layer region within the P-well region 105 and forming a P-type diffused layer region within the N-type diffused layer region. In short, this diode, like the resistor cell layout pattern, is formed as an element devoid of the polysilicon layer, so that again the problem of excess polishing is raised.

In case a bipolar transistor is arranged in place of the diffused layer resistor 107, the problem of excess polishing is similarly presented because the bipolar transistor is also not provided with the polysilicon layer.

In the foregoing, it has been indicated that the polysilicon layer is used as a gate electrode of the MIS transistor, while there is no polysilicon layer for the diode or the bipolar transistor. It is noted however that a polysilicon-metal gate, having a multi-layer structure of polysilicon and metal, a metal gate having a metal layer, or other multi-layer gate electrodes, including an additional layer of an electrically conductive material, may also be used as a gate electrode. Regardless of what material be used as the gate electrode layer of the MIS transistor, the excess polishing may occur in a region where there is provided an element such as a resistor, a diode or a bipolar transistor, not having a gate electrode, that is, a control electrode, on top of a semiconductor layer, which is counted for a problem.

It is a principal object of the present invention to provide a semiconductor device including an element exemplified by a resistor, a diode or a bipolar transistor, not having a control electrode layer, such as a polysilicon layer, according to which it is possible to avoid excess polishing during the process of planarization by CMP without increasing the layout size of the element and to eliminate offset of the threshold value Vt of an ambient MIS transistor from its design value.

It is envisaged by the present invention to overcome the problem of excess planarization of a gate electrode of a MIS transistor regardless of whichever of the polysilicon layer, polysilicon-metal layer or the metal layer, added by another layer(s) of an electrically conductive material to provide a multi-layer structure, is used as the gate electrode of the MIS transistor. Such a layer formed as the same layer as the gate electrode, the control electrode of the MIS transistor, such as the polysilicon layer, polysilicon-metal layer or the metal layer, added or not added by another layer(s) of an electrically conductive material to provide a multi-layer structure, is here termed the control electrode layer.

In a first aspect of the present invention, there is provided a semiconductor device comprising an element not including a control electrode layer on top of a semiconductor layer of a first conductivity type and including a region of impurity of a second conductivity type that is formed in the semiconductor layer, and a contact part formed surrounding the element. The contact part includes a plurality of control electrode layer portions arranged on top of the semiconductor layer for extending along an extending direction of the contact part and a plurality of contact regions of impurity of the first conductivity type that are arranged in the semiconductor layer. The control electrode layer portions are arranged in alternation with the contact regions.

In a second aspect of the present invention, there is provided a semiconductor device comprising an element not including a control electrode layer on top of a first well region of a first conductivity type and including a region of impurity of a second conductivity type that is formed in the first well region, and a first well contact part formed in the first well region surrounding the element. The first well contact part includes a plurality of first control electrode layer portions arranged on top of the first well region for extending along an extending direction of the first well contact part and a plurality of first well contact regions of impurity of the first conductivity type that are arranged in the first well region. The first control electrode layer portions are arranged in alternation with the first well contact regions.

In a third aspect, the present invention provides a semiconductor device comprising an element not including a control electrode layer on top of a first well region of a first conductivity type and including a region of impurity of a second conductivity type that is formed in the first well region, a second well region of a second conductivity type, and at least one of a first well contact part and a second well contact part. The second well region is formed surrounding the first well region. The first well contact part is formed in the first well region surrounding the element. The second well contact part is formed in the second well region surrounding the first well region. There are alternately arranged, in the at least one well contact part, a plurality of control electrode layer portions and a plurality of well contact regions. The control electrode layer portions are arranged on top of the well region concerned for extending along an extending direction of the at least one well contact part. The well contact regions are arranged in the well region concerned. The well contact regions are formed of impurity of the same conductivity type as that of the well region where the well contact regions are formed.

In a fourth aspect, the present invention provides a semiconductor device comprising an element not including a control electrode layer on top of a first region of impurity of a first conductivity type in a semiconductor substrate and including a second region of impurity of a second conductivity type that is formed in the first region of impurity, and a contact part formed surrounding the element. The contact part includes a plurality of control electrode layer portions arranged extending along an extending direction of the contact part and a plurality of contact regions arranged extending along an extending direction of the contact part. The control electrode layer portions are arranged in alternation with the contact regions. The contact regions are formed of impurity of the same conductivity type as that of the region of impurity of the semiconductor substrate the contact regions are in contact with.

In a fifth aspect according to the present invention, there is provided a semiconductor device comprising a resistor cell. The resistor cell includes a diffused layer resistor, a first contact and a second contact. The diffused layer resistor is arranged on top of a semiconductor substrate and is formed by a diffused layer. The first contact is arranged surrounding the outer rim of the diffused layer resistor and is formed by another diffused layer. The second contact is arranged surrounding the outer rim of the first contact and is formed by a further diffused layer. The first contact is formed by a succession of a plurality of partitioned first contact sections, and the second contact is formed by a succession of a plurality of partitioned second contact sections. A plurality of first control electrode layer portions is arranged between neighboring ones of the first contact sections so that the first contact sections and the first control electrode layer portions are arranged in alternation with one another. A plurality of second control electrode layer portions is arranged between neighboring ones of the second contact sections so that the second contact sections and the second control electrode layer portions are arranged in alternation with one another.

With the above semiconductor device of the present invention, the second control electrode layer portions are arranged on outer rim sides of the first contact sections, and the second contact sections are arranged on outer rim sides of the first control electrode layer portions. Preferably, a succession of the first contact sections and the first control electrode layer portions is offset relative to a succession of the second contact sections and the second control electrode layer portions.

According to the present invention, control electrode layer portions, such as polysilicon layers (109a, 109b of FIGS. 5A and 5B), provided between the P-well contact (106 of FIGS. 5A and 5B) and the N-well contacts (104 of FIGS. 5A and 5B)

or between the diffused layer resistor (107 of FIGS. 5A and 5B) and the P-well contact (106 of FIGS. 5A and 5B), as conventionally, may be dispensed with. It is thus possible to design the region between the P-well contact and the N-well contact or that between the diffused layer resistor and the P-well contact to be smaller in area and hence to avoid the resistor layout size from increasing. In addition, the P-well contact, provided on the outer rim of the resistor layer resistor, is partitioned into a plurality of P-well contact sections, and the N-well contact, provided on the outer rim of the P-well contact, is partitioned into a plurality of N-well contact sections. In-between the P-well contact sections, there may be provided a plurality of control electrode layer portions and, in-between the N-well contact sections, there may similarly be provided a plurality of control electrode layer portions. By so doing, it is possible to reduce the density of the control electrode layer portions on an outer rim part proximate to the elements not having control electrode layer portions, such as resistor cell layout patterns, diodes or the bipolar transistors, and hence to avoid excess polishing during the process of planarization by CMP. Since excessive polishing of the interlayer insulating film in a region of the elements not having control electrode layer portions, such as resistor cell layout patterns, diodes or bipolar transistors, may be avoided, it is possible to avoid grinding of the control electrode layer portion which is to be a gate electrode of a MIS transistor formed in a distinct area. It is thus possible to avoid grinding of the channel of the MIS transistor provided in the distinct area. There is thus no fear that the channel width of the MIS transistor becomes narrower than the design value, so that it becomes possible to have the threshold value Vt of the MIS transistor or the resistance value of the resistor cell equal to the design values.

PREFERRED MODES

Figure 1:
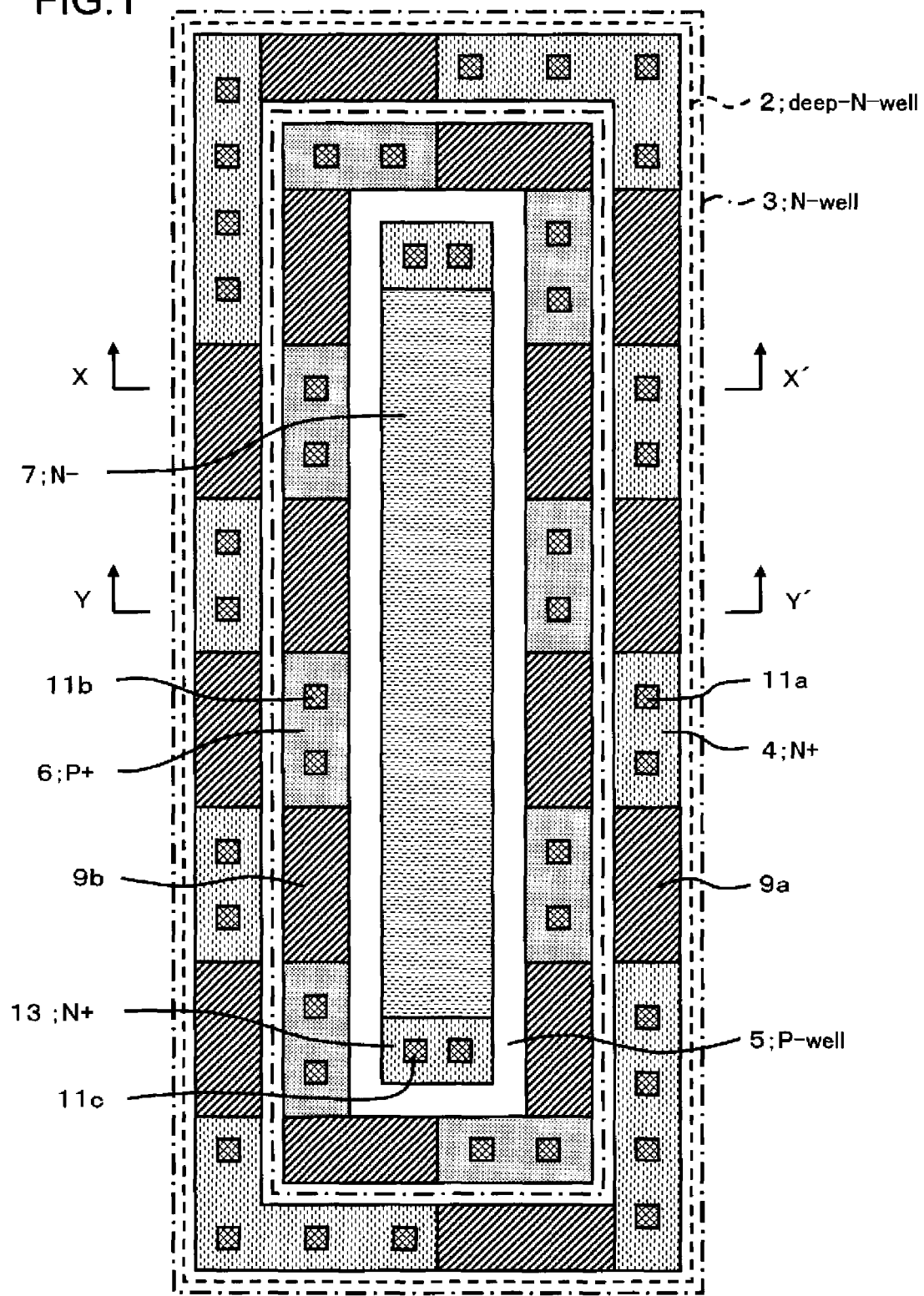
FIG. 1 is a partial plan view schematically showing a formulation of a resistor cell layout pattern in a semiconductor device according to Example 1 of the present invention.

There are variety of modes in the present invention.
Mode 1: as the first aspect.
Mode 2: as the second aspect.
Mode 3: In the semiconductor device, according to mode 2, may further comprising: a second well region of a second conductivity type that is formed surrounding the first well region; and a second well contact part formed in the second well region; the second well contact part including a plurality of second control electrode layer portions arranged on top of the second well region for extending along an extending direction of the second well contact part and a plurality of second well contact regions of impurity of the second conductivity type that are arranged in the second well region; the second control electrode layer portions being arranged in alternation with the second well contact regions.

Mode 4: The semiconductor device according to mode 3, wherein the first well contact regions may be arranged neighboring to the second control electrode layer portions; and the second well contact regions may be arranged neighboring to the first control electrode layer portions.

Mode 5: as the third aspect.

Mode 6: The semiconductor device according to any one of modes 3-5, wherein the second well region is formed surrounding a lower surface and lateral surfaces of the first well region.

Mode 7: as the fourth aspect.

Mode 8: The semiconductor device according to mode 7, wherein the contact part may be arranged in the first impurity region surrounding the element.

Mode 9: The semiconductor device according to mode 7, wherein the contact part may be arranged in a third impurity region of a second conductivity type surrounding the first impurity region.

Mode 10: The semiconductor device according to any one of modes 1-9, wherein the element may be a diffused layer resistor, a diode or a bipolar transistor.

Mode 11: as the fifth aspect.

Mode 12: The semiconductor device according to mode 11, wherein the second control electrode layer portions may be arranged on outer rim sides of the first contact sections; the second contact sections may be arranged on outer rim sides of the first control electrode layer portions; and a succession of the first contact sections and the first control electrode layer portions may be offset relative to a succession of the second contact sections and the second control electrode layer portions.

Mode 13: The semiconductor device according to mode 11 or 12, wherein the resistor cells may be arrayed side-by-side; and the second contact sections and the second control electrode layer portions, arranged in a region between neighboring ones of the resistor layer resistors, may be in common between neighboring ones of the resistor cells.

Mode 14: The semiconductor device according to any one of modes 11 to 13, wherein the semiconductor substrate may be a P-type silicon substrate; a deep N-well being formed at a preset depth in a preset region of the P-type silicon substrate; a P-well may be formed on top of the deep N-well; an N-well may be formed to get to the deep N-well in a region surrounding the P-well; the diffused layer resistor may be an N+ diffused layer formed on the P-well; the first contact sections may be a P+ diffused layer formed on the P-well apart from the diffused layer resistor; the second contact sections may be an N+ diffused layer formed on the N-well; the first control electrode layer portions may be arranged on top of the P-well via an insulating film; the second control electrode layer portions may be arranged on top of the N-well via an insulating film; and an interlayer insulating film may be provided on top of the semiconductor substrate that includes the N-well, second contact sections, P-well, first contact sections, diffused layer resistor, first control electrode layer portions and the second control electrode layer portions.

A semiconductor device according to an exemplary embodiment of the present invention includes a resistor cell. The resistor cell includes a diffused layer resistor (7 of FIG. 1) that is arranged on top of a semiconductor substrate (1 of FIGS. 2A and 2B) and that is formed by a diffused layer, and a P-well contact (6 of FIG. 1) that is arranged surrounding the outer rim of the diffused layer resistor (7 of FIG. 1) and that is formed by another diffused layer. The resistor cell also includes an N-well contact (4 of FIG. 1) that is arranged surrounding the outer rim of the P-well contact (6 of FIG. 1) and that is formed by a further diffused layer. The P-well contact (6 of FIG. 1) is formed by a succession of a plurality of partitioned P-well contact sections (partitioned portions of P-well contact 6 of FIG. 1), and the N-well contact (4 of FIG. 1) is formed by a succession of a plurality of partitioned N-well contact sections (partitioned portions of N-well contact 4 of FIG. 1). A plurality of first control electrode layer portions (9b of FIG. 1) is arranged between the neighboring P-well contact sections (6 of FIG. 1) so that the first contact sections (6 of FIG. 1) and the first control electrode layer portions (9b of FIG. 1) are arranged in alternation with one another. A plurality of second control electrode layer portions (9a of FIG. 1) is arranged between the neighboring N-well contact sections (4 of FIG. 1) so that the N-well contact sections (4 of FIG. 1) and the second control electrode layer portions (9a of FIG. 1) are arranged in alternation with one another. Depending on the properties required of the diffused layer resistors of actual products, it is also possible to use only the P-well contact sections or the N-well contact sections and to arrange the P-well contact sections or the N-well contact sections in alternation with control electrode layer portions. By the expression 'arranging in alternation' is here meant arranging in alternation in a plan view as in FIG. 1, hereinafter the same.

EXAMPLE 1

Figure 2A:
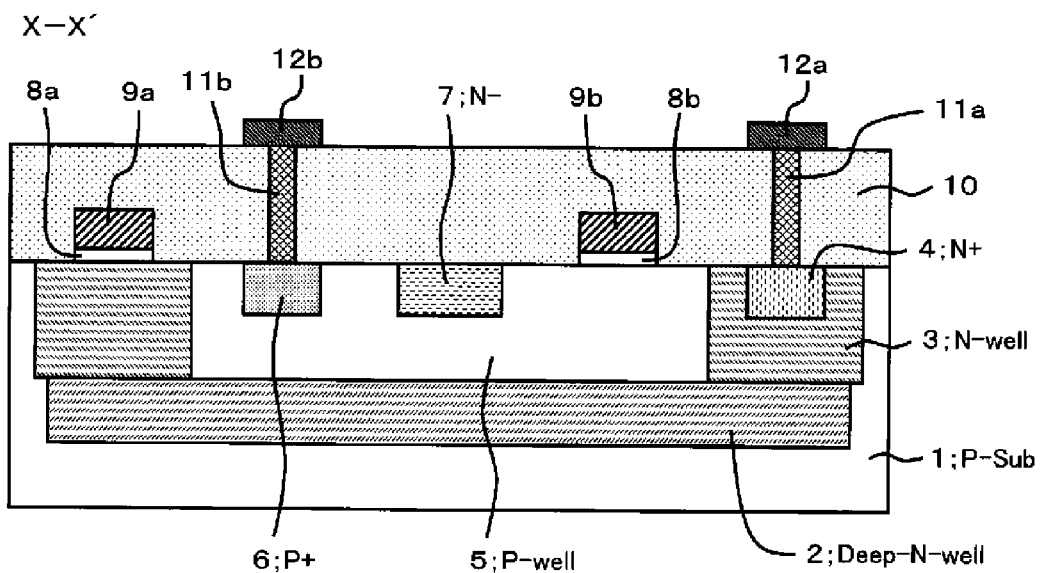
FIGS. 2A and 2B are cross-sectional views taken along line X-X' and along line Y-Y' of FIG. 1, respectively, for schematically showing the configuration of the resistor cell layout pattern in the semiconductor device according to Example 1 of the present invention.
Figure 2B:
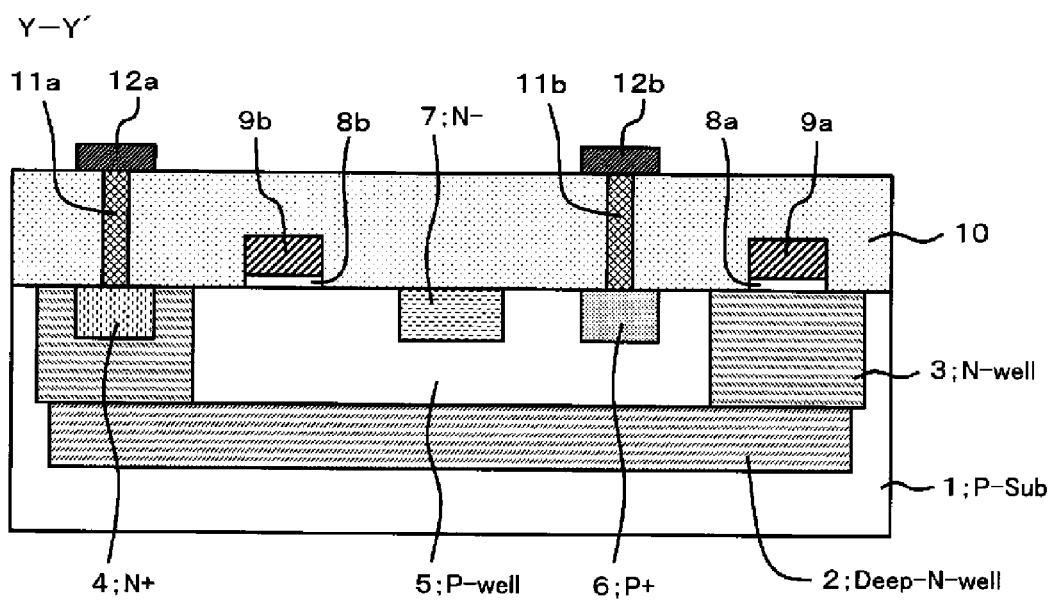

A semiconductor device according to Example 1 of the present invention will now be described with reference to the drawings. FIG. 1 schematically shows an arrangement of a resistor cell layout pattern in a semiconductor device according to Example 1 of the present invention. FIGS. 2A and 2B schematically show an arrangement of the resistor cell layout pattern in a semiconductor device according to Example 1 of the present invention. Specifically, FIGS. 2A and 2B are cross-sectional views taken along line X-X' and Y-Y' of FIG. 1, respectively. In FIG. 1, the interlayer insulating film 10 and interconnections 12a, 12b are omitted for simplicity.

Referring to FIGS. 1, 2A and 2B, a semiconductor device includes a P-type semiconductor substrate 1, such as a P-type silicon substrate. In a deeper portion of a region of a P-type semiconductor substrate 1 (e.g. a P-type silicon substrate) where a resistor cell layout pattern is formed, there is formed a deep N-well 2. In the semiconductor substrate 1 of the semiconductor device, a P-well 5 is formed on top of the deep N-well 2, and an N-well 3 is formed in a region surrounding the P-well 5. The N-well 3 gets to the rim part of the deep N-well 2. That is, the N-well 3 is formed surrounding the lateral surfaces of the P-well 5, and the deep N-well 2 is formed in contact with the lower side of the P-well 5. Hence, the P-well 5 is isolated from the semiconductor substrate 1 (P-sub) by the N-well 3 and the deep N-well 2.

An N-well contact 4, which is an N+ diffused layer, is formed in the N-well 3. The N-well contact 4 is partitioned into a plurality of sections by a plurality of control electrode layer portions 9a, such as polysilicon layer portions. The N-well contact sections are not provided below the control electrode layer portions 9a and, instead, are provided in regions between the neighboring control electrode layer portions 9a.

The control electrode layer portions 9a are provided on top of the N-well 3 between the neighboring N-well contact sections 4 (FIGS. 2A and 2B). The N-well contact sections 4 and the control electrode layer portions 9a are provided in alternation for extending so as to surround the P-well 5. On the inner rim sides of the N-well contact sections 4, there are provided control electrode layer portions 9b, such as polysilicon layer portions. On inner rim sides of the control electrode layer portions 9a, there are provided P-well contact sections 6. A succession of the N-well contact sections 4 and the control electrode layer portions 9a is arranged with a relative offset, along their extending direction, with respect to a succession of the P-well contact sections 6 and the control electrode layer portions 9b.

At the center part of the surface of the P-well 5 of the semiconductor device, a diffused layer resistor 7, which is a strip-shaped N-diffused layer, is formed. In the semiconductor device, a P-well contact 6, which is a P+ diffused layer, is formed on an outer rim of the diffused layer resistor 7 in the P-well to surround the diffused layer resistor 7. The P-well contact 6 is formed on a surface region of the P-well 5 between the diffused layer resistor 7 and the N-well 3 and is partitioned into a plurality of P-well contact sections by the control electrode layer portions 9b. The P-well contact sections 6, which are P+ diffused layers, are not provided below the control electrode layer portions 9b and, instead, are provided between the neighboring control electrode layer portions 9b. The control electrode layer portions 9b are each provided on top of the P-well 5, via insulating films 8b, in a region of the P-well 5 between the neighboring P-well contact sections 6 (FIGS. 2A and 2B). The P-well contact sections 6 and the control electrode layer portions 9b are arranged in alternation with one another and extend to surround the diffused layer resistor 7. The control electrode layer portions 9a are arranged on the outer rim of the P-well contact sections 6, while the N-well contact sections 4 are arranged on the outer rim of the control electrode layer portions 9b. The succession of the P-well contact sections 6 and the control electrode layer portions 9b is arranged with a relative offset, along their extending direction, with respect to the succession of the N-well contact sections 4 and the control electrode layer portions 9a. That is, the P-well contact sections 6 are arranged neighboring to the control electrode layer portions 9a, while the N-well contact sections 4 are arranged neighboring to the control electrode layer portions 9b. By the expression 'neighboring' is here meant neighboring when seen in the plan view of FIG. 1.

The semiconductor device includes an interlayer insulating film 10 on a semiconductor substrate 1 that includes the N-well 3, N-well contact 4, P-well 5, P-well contact 6, diffused layer resistor 7 and the control electrode layer portions 9a, 9b. A contact hole connecting to the N-well contact 4 has been formed in the interlayer insulating film 10, and a contact plug 11a is formed in the contact hole. The contact plug 11a is connected to an interconnection 12a provided on the interlayer insulating film 10. A contact hole connecting to the P-well contact section 6 has been formed in the interlayer insulating film 10, and a contact plug 11b is formed in the contact hole. The contact plug 11b is connected to an interconnection 12b provided on the interlayer insulating film 10. The interlayer insulating film 10 also includes a contact hole connecting to an N+ diffused layer 13 connected to an end of the diffused layer resistor 7, and a contact plug 11c is provided in the contact hole. The contact plug 11c is coupled to an interconnection, not shown, provided on the interlayer insulating film 10.

The control electrode layer portions 9a, 9b are aimed to avoid excess polishing in the process of planarization by CMP (Chemical Mechanical Polishing). The density of the control electrode layer portions 9a, 9b may be adjusted in a desired manner to an even value. To adjust the density of the control electrode layer portions, the succession of the P-well contacts sections 6 and the control electrode layer portions 9b may be arranged with a desired relative offset, along their extending direction, with respect to the succession of the N-well contact sections 4 and the control electrode layer portions 9a. Alternatively, the spacing between the neighboring N-well contact sections 4 or that between the P-well contact sections 6 may be adjusted to provide for an even density value.

An example of the method for manufacturing a semiconductor device of Example 1 of the present invention will now be described.

Initially, a resist having a window for forming the deep N-well 2 is formed on the P-type semiconductor substrate 1. Using the resist as a mask, the deep N-well 2 is formed by implanting N-type impurity. The resist is then removed.

A resist having a window for forming the P-well 5 is then formed on the semiconductor substrate 1 provided with the deep N-well 2. Using the resist as a mask, the P-well 5 is formed by implanting P-type impurity. The resist is then removed.

A resist having a window for forming the N-well 3 is then formed on the semiconductor substrate 1 provided with the P-well 5. Using the resist as a mask, the N-well 3 is formed by implanting N-type impurity. The resist is then removed.

A resist having a window for forming the diffused layer resistor 7 is then formed on the semiconductor substrate 1 provided with the P-well 5 and with the N-well 3. Using the resist as a mask, the diffused layer resistor 7 is formed by implanting N-type impurity. The resist is then removed.

A resist having a window for forming the N-well contact 4 and the N+ diffused layer 13 is then formed on the semiconductor substrate 1 provided with the P-well 5 and the N-well 3. Using the resist as a mask, the N-well contact 4 and the N+ diffused layer 13 are formed by implanting N-type impurity. The resist is then removed.

A resist having a window for forming the P-well contact 6 is then formed on the semiconductor substrate 1 provided with the P-well 5 and with the N-well 3. Using the resist as a mask, the P-well contact 6 is formed by implanting P-type impurity. The resist is then removed.

An insulating film, which is to form insulating films 8a, 8b, is then formed on the semiconductor substrate 1, thus provided with the N-well 3, N-well contact 4, P-well 5, P-well contact 6 and the diffused layer resistor 7. A polysilicon layer, as an electrically conductive layer which is to form the control electrode layer portions 9a, 9b, for example, is then formed.

A resist having windows for forming the control electrode layer portions 9a, 9b is then formed. Then, using the resist as a mask, the exposed portions of the control electrode layer and the insulating film are etched off to form the control electrode layer portions 9a, 9b and the insulating film portions 8a, 8b. The resist is then removed.

The interlayer insulating film 10 then is formed on the semiconductor substrate 1, thus provided with the N-well 3, N-well contact 4, P-well 5, P-well contact 6, diffused layer resistor 7 and the control electrode layer portions 9a, 9b.

The interlayer insulating film 10 then has its surface planarized by CMP.

A resist having windows for forming contact holes for forming contact plugs 11a to 11c is then formed on the interlayer insulating film 10. Then, using the resist as a mask, the exposed portions of the interlayer insulating film 10 are removed until the N-well contact 4 and the P-well contact 6 are exposed. The resist is then removed.

The contact plugs 11a to 11c are then formed in the contact holes formed in the interlayer insulating film 10.

The interconnections 12a, 12b are then formed at preset positions on the interlayer insulating film 10 now provided with the contact plugs 11a to 11c. This completes the semiconductor device shown in FIGS. 1, 2A and 2B.

Figure 5A:
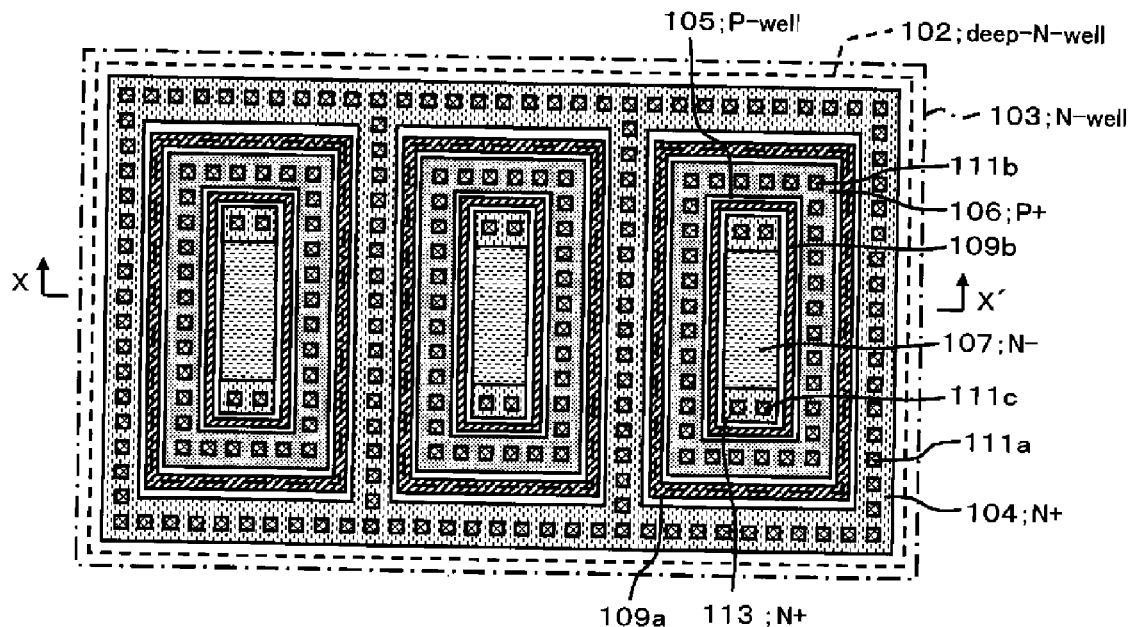
FIG. 5A is a partial plan view schematically showing the configuration of a resistor cell layout pattern in the semiconductor device according to a related art example 2.
Figure 5B:
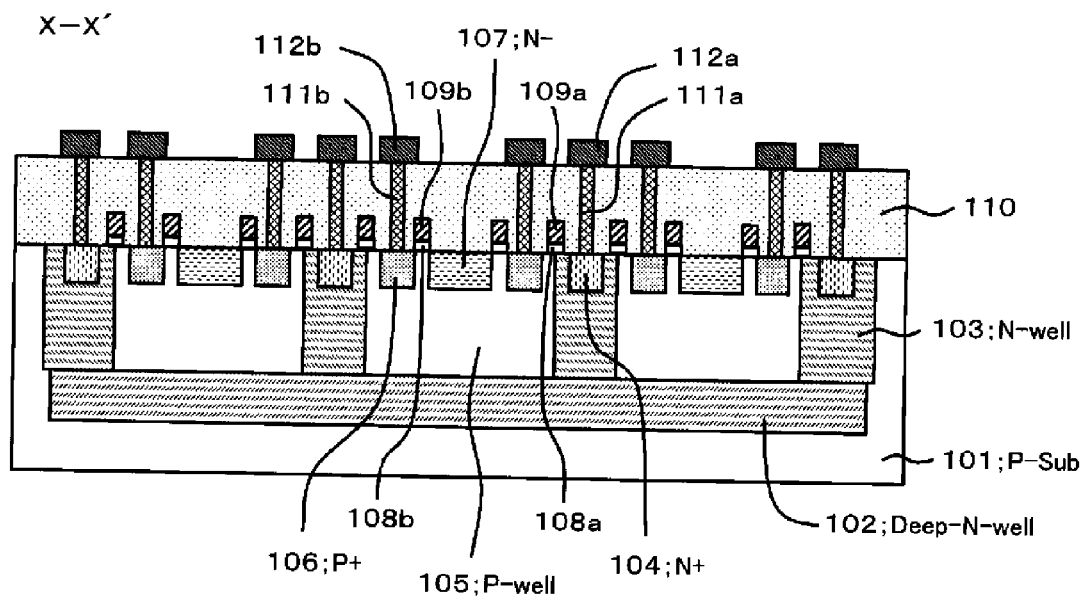
FIG. 5B is a cross-sectional view taken along line X-X' of FIG. 4A.

With the Example 1, the control electrode layer portions, corresponding to the polysilicon layers (109a, 109b of FIGS. 5A and 5B), and which are arranged in the conventional system between the P-well contact (106 of FIGS. 5A and 5B) and the N-well contact (104 of FIGS. 5A and 5B) or between the diffused layer resistor (107 of FIGS. 5A and 5B) and the P-well contact (106 of FIGS. 5A and 5B), may be dispensed with. It is thus possible to reduce the size of the area between the P-well contact (106 of FIGS. 5A and 5B) and the N-well contact (104 of FIGS. 5A and 5B) or that between the diffused layer resistor (107 of FIGS. 5A and 5B) and the P-well contact (106 of FIGS. 5A and 5B) to avoid the resistor layout size from increasing.

Moreover, the P-well contact 6 formed on the outer rim of the diffused layer resistor 7 is partitioned into a plurality of P-well contact sections 6, and the N-well contact 4 formed on the outer rim of the P-well contact 6 is partitioned into a plurality of N-well contact sections 4. The control electrode layer portions 9b are arranged between the neighboring P-well contact sections 6, and the control electrode layer portions 9a are arranged between the neighboring N-well contact sections 4. By so doing, it is possible to raise the density of the control electrode layer portions in the resistor cell layout pattern as well as to prevent excessive polishing during the process of planarization by CMP. By avoiding excess polishing in the resistor cell layout pattern, it is possible to prevent grinding of the gate electrode of the MIS transistor formed in a distinct area, so that there is no fear of the MIS transistor becoming narrower in width than the design value. The threshold voltage Vt of the MIS transistor and the resistance of the resistor cell may thus be made equal to their respective design values.

EXAMPLE 2

Figure 3:
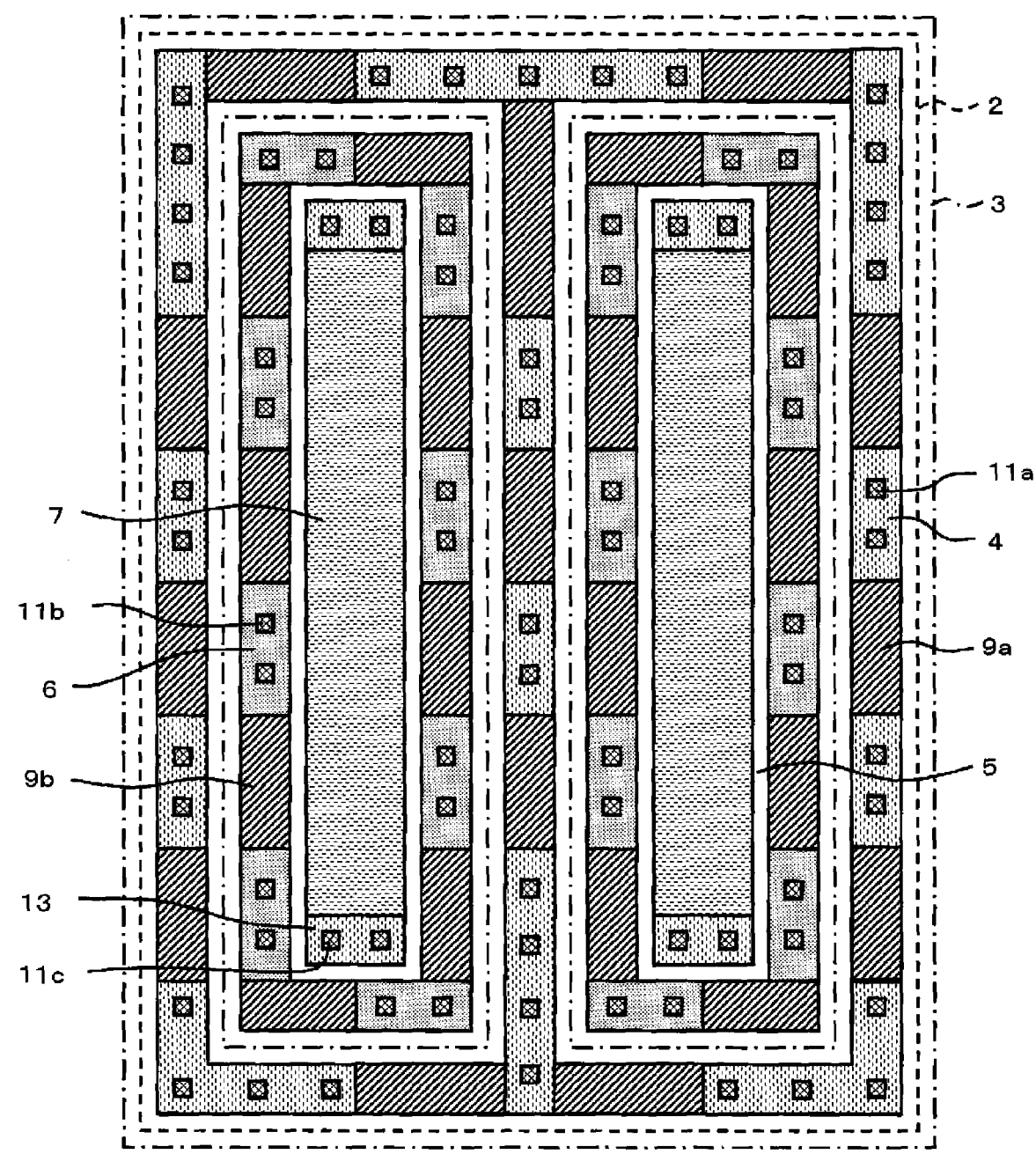
FIG. 3 is a partial plan view schematically showing a formulation of a resistor cell layout pattern in a semiconductor device according to Example 2 of the present invention.
Figure 4A:
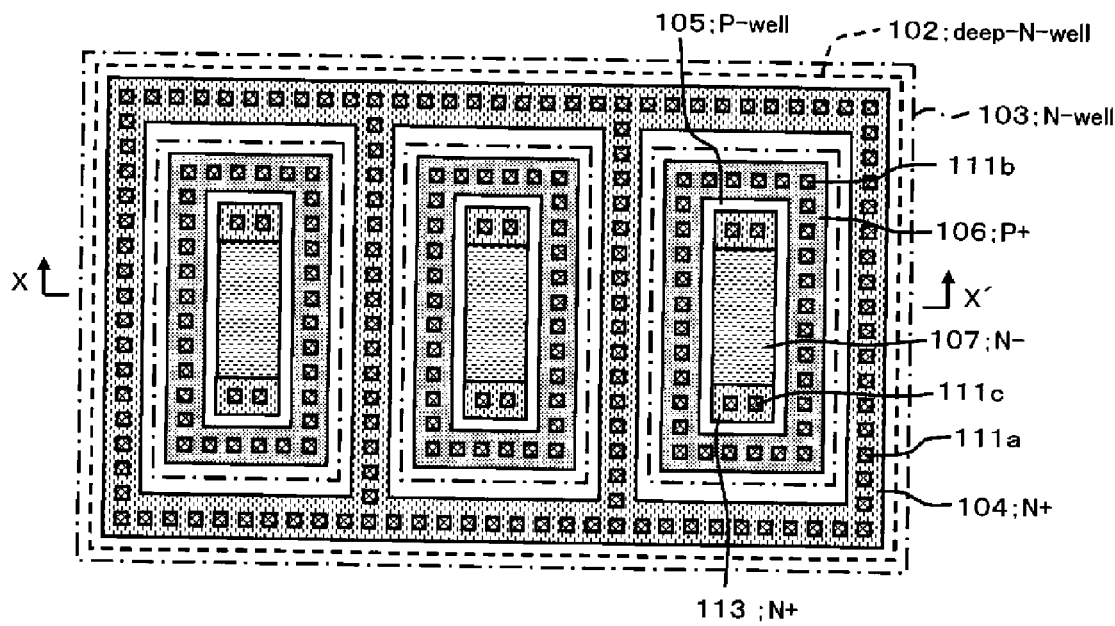
FIG. 4A is a partial plan view schematically showing the configuration of a resistor cell layout pattern in the semiconductor device according to a related art example 1.
Figure 4B:
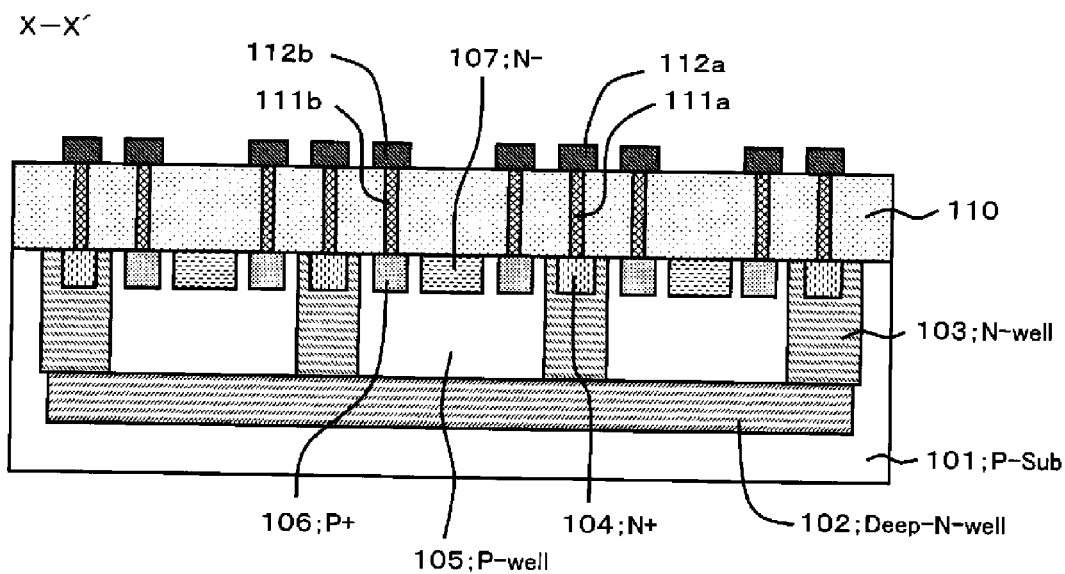
FIG. 4B is a cross-sectional view taken along line X-X' of FIG. 4A.

A semiconductor device according to Example 2 of the present invention will now be described with reference to the drawings. FIG. 3 depicts a schematic partial plan view showing a formulation of a resistor cell layout pattern in a semiconductor device according to Example 2 of the present invention.

The resistor cell layout pattern of Example 2 is a juxtaposition of two resistor cell layout patterns of Example 1 (see FIG. 1). The N-well contact sections 4 and the control electrode layer portions 9a, arranged between two neighboring diffused layer resistors 7, are used in common between the neighboring resistor cells. Other formulations of Example 2, including the formulation of the cross-section, are the same as those of Example 1. The present Example 2 yields the same meritorious effects as those of Example 1. In addition, since the N-well contact sections 4 and the control electrode layer portions 9a are used in common between the neighboring resistor cells, there is no fear that the density of the control electrode layer portions 9a, 9b is excessively increased. Hence, the thickness of the interlayer insulating film (corresponding to 10 of FIGS. 2A and 2B), formed thereon, is not uneven, such that, when the wafer is planarized in its entirety, no step difference is produced.

EXAMPLE 3

An Example 3 of the present invention, according to which an element not having a control electrode layer, such as a polysilicon layer, is a diode, is now explained.

In the present Example 3, a PN junction of the diode, arranged in place of the diffused layer resistor 7 used in Example 1, shown in FIGS. 1, 2A and 2B, is obtained by forming an N-type diffused layer in a P-well 5 and forming a P-type diffused layer within the region of the so formed N-type diffused layer. There are formed contact holes in the interlayer insulating film 10 communicating with the N-type diffused layer and the P-type diffused layer, and contact plugs are provided in these contact holes. These contact plugs are coupled to interconnections provided on top of the interlayer insulating film 10.

A P-type diffused layer may also be formed in the region of the diffused layer resistor 7 (N-diffused layer) and a contact plug communicating with the P-type diffused layer may also be formed to provide a diode configuration. The concentration of impurities in the respective diffused layers may be adjusted to obtain desired diode characteristics.

A plurality of the diodes may be arranged and interconnected in series or in parallel with one another, as in the case of the resistor cell layout patterns of Example 2.

With the present Example 3, it is possible to raise the density of the control electrode layer portions proximate to an outer rim of a device not including a control electrode layer, such as a diode, formed within the P-well 5. In this case, a succession of the P-well contact sections 6 and the control electrode layer portions 9b, provided in alternation with one another in the extending direction, is arranged on an outer rim of the diode. In addition, a succession of the N-well contact sections 4 and the control electrode layer portions 9a, provided in alternation with one another in the extending direction, is arranged on an outer rim of the so formed succession of the P-well contact sections and the control electrode layer portions, as in the case of the resistor cell layout pattern described above. It is thus possible not only to raise the density of the control electrode layer portions proximate to the outer rim of the element not having the control electrode layer portions, such as a diode, but also to avoid the gate electrode of the MIS transistor provided in a distinct region from being ground off.

EXAMPLE 4

A semiconductor device according to Example 4 of the present invention, in which an element not having a control electrode layer, such as a polysilicon layer, is a bipolar transistor, is now explained.

In the present Example 4, a bipolar transistor is arranged in place of the diffused layer resistor 7 in Example 1 (see FIGS. 1, 2A and 2B). For example, an NPN bipolar transistor may be obtained by forming a region of an N-type diffused layer in the region of the P-well 5, then forming a region of a P-type diffused layer within the region of the so formed N-type diffused layer, and further forming a region of another N-type diffused layer within the region of the so formed P-type diffused layer. There are formed in the interlayer insulating film 10 contact holes communicating with the N-type diffused layer, P-type diffused layer and the other N-type diffused layer that together make up the NPN bipolar transistor. In these contact holes, there are provided contact plugs connecting to interconnections provided on top of the interlayer insulating film 10.

In the Example 1, it is also possible to provide a region of a P-type diffused layer within a region of the diffused layer resistor (N-diffused layer) 7, to provide a region of an N-type diffused layer within the region of the so formed P-type diffused layer and to form contact plugs communicating with the respective regions of the diffused layer to provide an NPN bipolar transistor. The concentrations of the impurity of the respective diffused layer portions may be adjusted to obtain desired bipolar transistor characteristics.

As in the resistor cell layout pattern of Example 2, a plurality of bipolar transistors may be arranged parallel to one another and interconnected in parallel, in series or by Darlington connection.

With the present Example 4, it is possible to raise the density of the control electrode layer portions neighboring to an outer rim of a device not having a control electrode layer, such as a bipolar transistor, formed within the region of the P-well 5. In this case, a succession of the P-well contact sections 6 and the control electrode layer portions 9b, provided in alternation with one another in the extending direction, and a succession of the N-well contact sections 4 and the control electrode layer portions 9a, provided in alternation with one another in the extending direction, are sequentially arranged, as in the case of the resistor cell layout pattern described above. It is thus possible to avoid grinding-down of the gate electrode of the MIS transistor provided in the other region.

Meanwhile, the present invention is applied to an N-well contact or to a P-well contact arranged around a resistor element which is used for a supply power generation circuit and which it is necessary to protect from instabilities of the well brought about by noise from a semiconductor substrate. However, the present invention is not limited to such resistor element in need of high accuracy, and may be applied to an N-well contact or to a P-well contact arranged around an element not having a control electrode layer (or layer portions), such as a resistor element, a diode or a bipolar transistor. When the present invention is applied for such case, it is possible to avoid excess polishing as well as deterioration of circuit characteristics of the semiconductor device without increasing the layout area.

In the above description, it has been indicated that an N-well, a P-well, an N-diffused layer resistor or a diode, and a control electrode layer, are formed on a semiconductor substrate of the P-conductivity type (P-sub). It is however also possible to form an N-well, a P-well, a P-diffused layer resistor or diode, and a control electrode layer, on a semiconductor substrate of the N-conductivity type (N-sub). The meritorious effect similar to that described above may be obtained with the use of the semiconductor substrate of the N-conductivity type (N-sub).

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
an element not including a control electrode layer on top of a semiconductor layer of a first conductivity type and including a region of impurity of a second conductivity type that is formed in said semiconductor layer; and
a contact part formed surrounding said element; wherein said contact part includes a plurality of control electrode layer portions arranged on top of said semiconductor layer for extending along an extending direction of said contact part and a plurality of contact regions of impurity of the first conductivity type that are arranged in said semiconductor layer; said control electrode layer portions being arranged in alternation with said contact regions.

2. A semiconductor device, comprising:
an element not including a control electrode layer on top of a first well region of a first conductivity type and including a region of impurity of a second conductivity type that is formed in the first well region; and
a first well contact part formed in said first well region surrounding said element; wherein
said first well contact part includes a plurality of first control electrode layer portions arranged on top of said first well region for extending along an extending direction of said first well contact part and a plurality of first well contact regions of impurity of the first conductivity type that are arranged in said first well region; said first control electrode layer portions being arranged in alternation with said first well contact regions.

3. The semiconductor device, according to claim 2, further comprising:
a second well region of a second conductivity type that is formed surrounding said first well region; and
a second well contact part formed in said second well region;
said second well contact part including a plurality of second control electrode layer portions arranged on top of said second well region for extending along an extending direction of said second well contact part and a plurality of second well contact regions of impurity of the second conductivity type that are arranged in said second well region; said second control electrode layer portions being arranged in alternation with said second well contact regions.

4. The semiconductor device according to claim 3, wherein
said first well contact regions are arranged neighboring to said second control electrode layer portions;
said second well contact regions being arranged neighboring to said first control electrode layer portions.

5. A semiconductor device, comprising:
an element not including a control electrode layer on top of a first well region of a first conductivity type and including a region of impurity of a second conductivity type that is formed in said first well region;
a second well region of a second conductivity type that is formed surrounding said first well region; and
at least one of a first well contact part formed in said first well contact region surrounding said element and a second well contact part formed in said second well contact region surrounding said first well region;
there being alternately arranged, in said at least one well contact part, a plurality of control electrode layer portions and a plurality of well contact regions; said control electrode layer portions being arranged on top of the well region concerned for extending along an extending direction of said at least one well contact part; said well contact regions being arranged in the well region concerned;
said well contact regions being formed of impurity of the same conductivity type as that of the well region where said well contact regions are formed.

6. The semiconductor device according to claim 3, wherein said second well region is formed surrounding a lower surface and lateral surfaces of said first well region.

7. The semiconductor device according to claim 5, wherein said second well region is formed surrounding a lower surface and lateral surfaces of said first well region.

8. A semiconductor device, comprising:
an element not including a control electrode layer on top of a first region of impurity of a first conductivity type in a semiconductor substrate and including a second region of impurity of a second conductivity type that is formed in said first region of impurity; and
a contact part formed surrounding said element;
said contact part including:
a plurality of control electrode layer portions arranged extending along an extending direction of said contact part and a plurality of contact regions arranged extending along an extending direction of said contact part; said control electrode layer portions being arranged in alternation with said contact regions;
said contact regions being formed of impurity of the same conductivity type as that of said region of impurity of said semiconductor substrate said contact regions are in contact with.

9. The semiconductor device according to claim 8 wherein said contact part is arranged in said first impurity region surrounding said element.

10. The semiconductor device according to claim 8 wherein said contact part is arranged in a third impurity region of a second conductivity type surrounding said first impurity region.

11. The semiconductor device according to claim 1 wherein said element is a diffused layer resistor, a diode or a bipolar transistor.

12. The semiconductor device according to claim 3 wherein said element is a diffused layer resistor, a diode or a bipolar transistor.

13. The semiconductor device according to claim 5 wherein said element is a diffused layer resistor, a diode or a bipolar transistor.

14. The semiconductor device according to claim 8 wherein said element is a diffused layer resistor, a diode or a bipolar transistor.

15. A semiconductor device, comprising:
at least one resistor cell;
said resistor cell including:
a diffused layer resistor that is arranged on top of a semiconductor substrate and that is formed by a diffused layer;
a first contact that is arranged encircling an outer rim of said diffused layer resistor and that is formed by a diffused layer; and
a second contact that is arranged encircling an outer rim of said first contact and that is formed by a diffused layer; wherein
said first contact formed by a succession of a plurality of partitioned first contact sections;
said second contact being a succession of a plurality of partitioned second contact sections;
a plurality of first control electrode layer portions being arranged between neighboring ones of said first contact sections so that said first contact sections and said first control electrode layer portions are arranged in alternation with one another;
a plurality of second control electrode layer portions being arranged between neighboring ones of said second contact sections so that said second contact sections and said second control electrode layer portions are arranged in alternation with one another.

16. The semiconductor device according to claim 15, wherein
said second control electrode layer portions are arranged on outer rim sides of said first contact sections;

said second contact sections being arranged on outer rim sides of said first control electrode layer portions;

a succession of said first contact sections and said first control electrode layer portions being offset relative to a succession of said second contact sections and said second control electrode layer portions.

17. The semiconductor device according to claim 15, wherein said resistor cells are arrayed side-by-side;

said second contact sections and said second control electrode layer portions, arranged in a region between neighboring ones of said resistor layer resistors, are in common between neighboring ones of said resistor cells.

18. The semiconductor device according to claim 15, wherein said semiconductor substrate is a P-type silicon substrate; a deep N-well being formed at a preset depth in a preset region of said P-type silicon substrate;

a P-well being formed on top of said deep N-well; an N-well being formed to get to said deep N-well in a region surrounding said P-well;

said diffused layer resistor being an N+ diffused layer formed on said P-well;

said first contact sections being a P+ diffused layer formed on said P-well apart from said diffused layer resistor;

said second contact sections being an N+ diffused layer formed on said N-well;

said first control electrode layer portions being arranged on top of said P-well via an insulating film;

said second control electrode layer portions being arranged on top of said N-well via an insulating film;

an interlayer insulating film being provided on top of said semiconductor substrate that includes said N-well, second contact sections, P-well, first contact sections, diffused layer resistor, first control electrode layer portions and said second control electrode layer portions.

* * * * *